United States Patent
de Jong et al.

(10) Patent No.: US 9,466,653 B2
(45) Date of Patent: Oct. 11, 2016

(54) ELECTRONIC DEVICES WITH DISPLAY-INTEGRATED LIGHT SENSORS

(71) Applicant: Apple Inc., Cupertino, CA (US)

(72) Inventors: Erik G. de Jong, San Francisco, CA (US); Anna-Katrina Shedletsky, Mountain View, CA (US); Prashanth S. Holenarsipur, Fremont, CA (US)

(73) Assignee: Apple Inc., Cupertino, CA (US)

( * ) Notice: Subject to any disclaimer, the term of this patent is extended or adjusted under 35 U.S.C. 154(b) by 69 days.

(21) Appl. No.: 14/752,702

(22) Filed: Jun. 26, 2015

(65) Prior Publication Data

US 2015/0303244 A1    Oct. 22, 2015

Related U.S. Application Data

(63) Continuation of application No. 13/686,746, filed on Nov. 27, 2012, now Pat. No. 9,070,648.

(51) Int. Cl.
*G01J 1/32* (2006.01)
*H01L 27/32* (2006.01)

(52) U.S. Cl.
CPC ......... *H01L 27/3269* (2013.01); *H01L 27/323* (2013.01); *H01L 27/3227* (2013.01); *H01L 27/3276* (2013.01)

(58) Field of Classification Search
CPC .................................................. H01L 27/3269
USPC ......................................................... 250/205
See application file for complete search history.

(56) References Cited

U.S. PATENT DOCUMENTS

| | | |
|---|---|---|
| 6,339,429 B1 | 1/2002 | Schug |
| 6,459,436 B1 | 10/2002 | Kumada |
| 7,460,196 B2 | 12/2008 | Kim |
| 7,825,891 B2 | 11/2010 | Yao et al. |
| 7,960,682 B2 | 6/2011 | Gardner, Jr. |
| 8,194,031 B2 | 6/2012 | Yao et al. |
| 8,361,818 B2 | 1/2013 | Cho et al. |
| 8,384,003 B2 | 2/2013 | Gardner, Jr. |
| 8,987,652 B2 | 3/2015 | Zheng |
| 9,024,530 B2 | 5/2015 | Land et al. |
| 2002/0079512 A1 | 6/2002 | Yamazaki et al. |

(Continued)

FOREIGN PATENT DOCUMENTS

| | | |
|---|---|---|
| EP | 1335430 | 8/2003 |
| EP | 2144293 | 1/2010 |

(Continued)

*Primary Examiner* — Ajay K Arora
(74) *Attorney, Agent, or Firm* — Treyz Law Group, P.C.; Zachary D. Hadd (57) ABSTRACT

An electronic device is provided, with a display and a display-integrated light sensor. The display includes a transparent cover layer, light-generating layers, and a touch-sensitive layer. The display-integrated light sensor is interposed between the transparent cover layer and a display layer such as the touch-sensitive layer or a thin-film transistor layer of the light-generating layers. The light-generating layers include a layer of organic light-emitting material. The display-integrated light sensor can be implemented as an ambient light sensor or a proximity sensor. The display-integrated light sensor may be a packaged light sensor that is integrated into the display layers of the display or may be formed from light-sensor components formed directly on a display circuitry layer such as the touch-sensitive layer or the thin-film transistor layer.

20 Claims, 11 Drawing Sheets

(56) References Cited

U.S. PATENT DOCUMENTS

| | | |
|---|---|---|
| 2003/0174870 A1 | 9/2003 | Kim et al. |
| 2003/0189211 A1 | 10/2003 | Deitz |
| 2003/0189586 A1 | 10/2003 | Vronay |
| 2004/0036820 A1 | 2/2004 | Runolinna |
| 2004/0095402 A1 | 5/2004 | Nakano |
| 2004/0140762 A1 | 7/2004 | Tohma et al. |
| 2005/0056842 A1 | 3/2005 | Nishi et al. |
| 2005/0219197 A1 | 10/2005 | Pasqualini et al. |
| 2006/0033016 A1 | 2/2006 | Ogawa et al. |
| 2006/0049533 A1 | 3/2006 | Kamoshita |
| 2006/0267625 A1 | 11/2006 | Kaneko |
| 2007/0236485 A1 | 10/2007 | Trepte |
| 2008/0284716 A1 | 11/2008 | Edwards |
| 2009/0002341 A1 | 1/2009 | Saito et al. |
| 2010/0079426 A1 | 4/2010 | Pance et al. |
| 2010/0177046 A1 | 7/2010 | Shin et al. |
| 2011/0248961 A1 | 10/2011 | Svajda et al. |
| 2012/0153153 A1 | 6/2012 | Change et al. |
| 2012/0218239 A1 | 8/2012 | Yao et al. |
| 2013/0002731 A1 | 1/2013 | Tam |
| 2013/0076712 A1* | 3/2013 | Zheng .................. G09G 5/00 345/207 |
| 2013/0106813 A1 | 5/2013 | Hotelling et al. |
| 2013/0161489 A1 | 6/2013 | Gardner |
| 2014/0085265 A1 | 3/2014 | Yin |
| 2014/0132578 A1 | 5/2014 | Zheng |
| 2014/0183342 A1 | 7/2014 | Shedletsky et al. |

FOREIGN PATENT DOCUMENTS

| | | |
|---|---|---|
| WO | 00/41378 | 7/2000 |
| WO | 02/37454 | 5/2002 |
| WO | 2007/069107 | 6/2007 |

\* cited by examiner

ELECTRONIC DEVICES WITH DISPLAY-INTEGRATED LIGHT SENSORS

This application is a continuation of U.S. patent application Ser. No. 13/686,746, filed Nov. 27, 2012, which is hereby incorporated by reference herein in its entirety. This application claims the benefit of and claims priority to U.S. patent application Ser. No. 13/686,746, filed Nov. 27, 2012.

BACKGROUND

This relates generally to electronic devices and, more particularly, to electronic devices with displays and light sensors.

Electronic devices often include displays. For example, cellular telephones and portable computers often include displays for presenting information to a user.

Electronic devices also often include light sensors. For example, an electronic device may include an ambient light sensor that senses the amount of light in the environment surrounding the device. The brightness of display images generated by the display is sometimes adjusted based on the amount of ambient light. For example, in bright sunlight, the display brightness may be increased and in a dark room, the display brightness can be decreased.

In a typical device, a light sensor is laterally displaced from an active display region of the display along a front face of the device. Additional space is therefore provided in common devices at the top, bottom, or side of the active display area to accommodate the light sensor. This can result in an undesirable increase in the size and weight of the device, if care is not taken, displays may be bulky or may be surrounded by overly large borders.

It would therefore be desirable to be able to provide improved electronic devices with light sensors and displays.

SUMMARY

An electronic device is provided with a display such as an organic light-emitting diode display mounted in an electronic device housing. The electronic device is also provided with one or more light sensors.

The display includes multiple display layers such as one or more light-generating layers, a touch-sensitive layer, and a cover layer. The cover layer may, for example, be a layer of rigid transparent material such as glass or transparent plastic.

The light sensor is a display-integrated light sensor that is integrated into the layers of the display. The light, sensor may foe interposed between the cover layer and another layer of the display such as the touch-sensitive layer, the light-generating layers, or another display layer.

The light sensor may be an ambient light sensor that senses light having primarily optical wavelengths, a proximity sensor that includes a light-generating component and a light-sensitive component, or any other light sensor.

The light sensor may be a packaged light sensor that is integrated into the layers of the display or may be a light sensor formed from light sensor components that are formed on a display layer that includes conductive traces. In one example, the light sensor is formed from a light-emitting component such as a light-emitting diode and a light-sensitive component such as a photodiode formed on a thin-film transistor layer of the display.

Further features, their nature and various advantages will be more apparent, from the accompanying drawings and the following detailed description of the preferred embodiments.

DETAILED DESCRIPTION

Electronic devices may be provided with displays and light sensors that are integrated into layers of the display. Illustrative electronic devices that have displays and display-integrated light sensors are shown in FIGS. 1, 2, 3, and 4.

Figure 1:
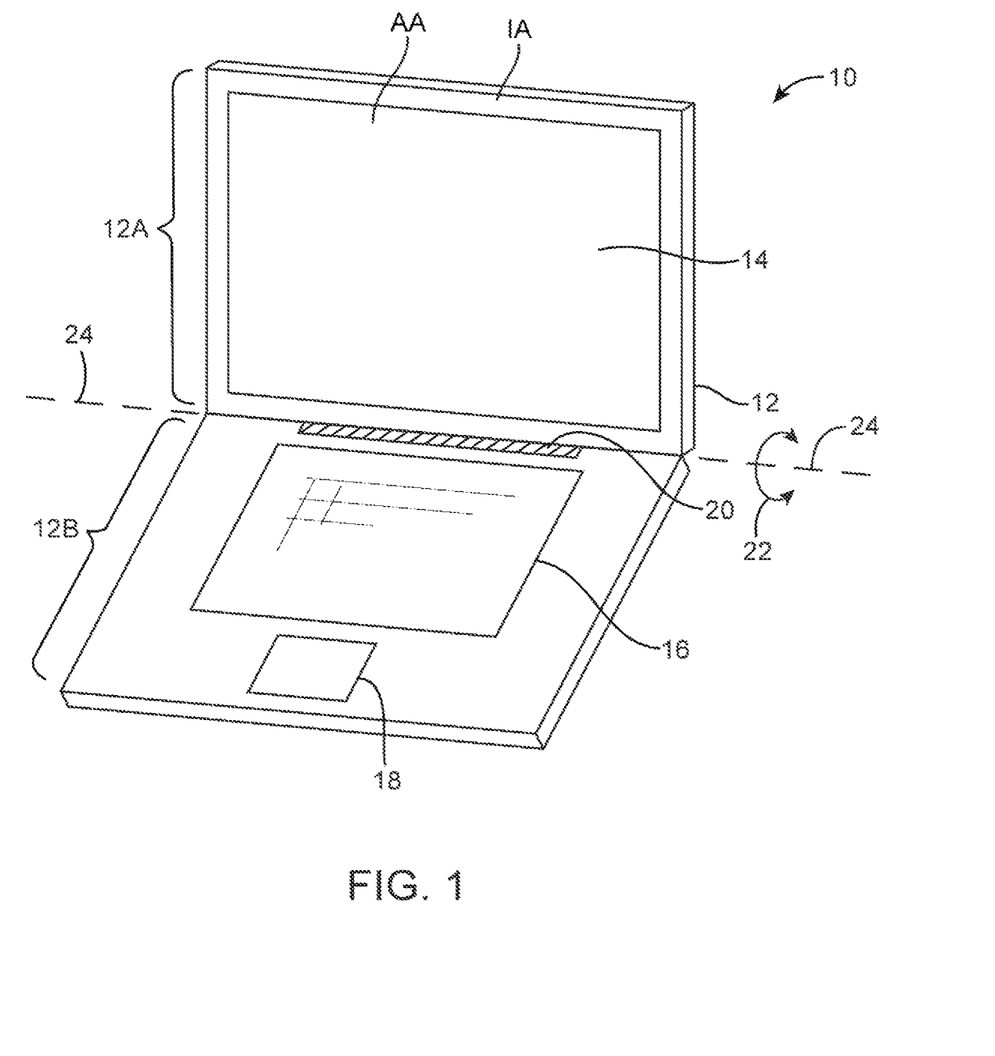
FIG. 1 is a perspective view of an illustrative electronic device such as a laptop computer with a display-integrated light sensor in accordance with an embodiment.

Electronic device 10 of FIG. 1 has the shape of a laptop computer and has upper housing 12A and lower housing 12B with components such as keyboard 16 and touchpad 18. Device 10 has hinge structures 20 to allow upper housing 12A to rotate in directions 22 about rotational axis 24 relative to lower housing 12B. Display 14 is mounted in upper housing 12A. Upper housing 12A, which may sometimes referred to as a display housing or lid, is placed in a closed position by rotating upper housing 12A towards lower housing 12B about rotational axis 24.

Figure 2:
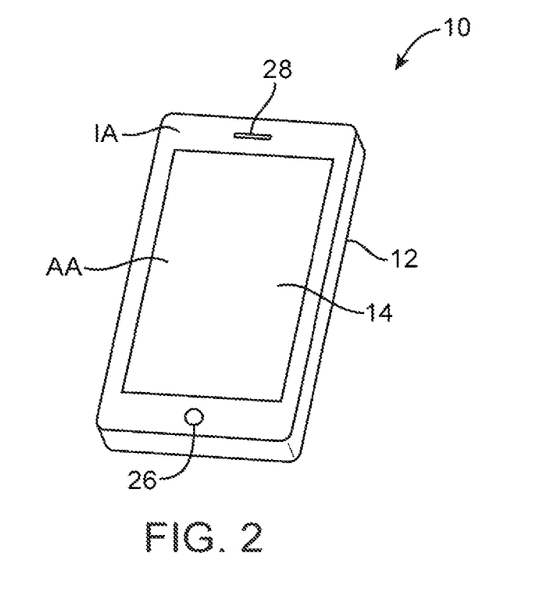
FIG. 2 is a perspective view of an illustrative electronic device such as a handheld electronic device with a display-integrated light sensor in accordance with an embodiment.

FIG. 2 shows an illustrative configuration for electronic device 10 in which device 10 is implemented as a handheld device such as a cellular telephone, music player, gaming device, navigation unit, or other compact device. In this type of configuration for device 10, housing 12 has opposing front and rear surfaces. Display 14 is mounted on a front face of housing 12. Display 14 may have an exterior layer such as a rigid transparent layer that includes openings for components such as button 26 and speaker port 28.

Figure 3:
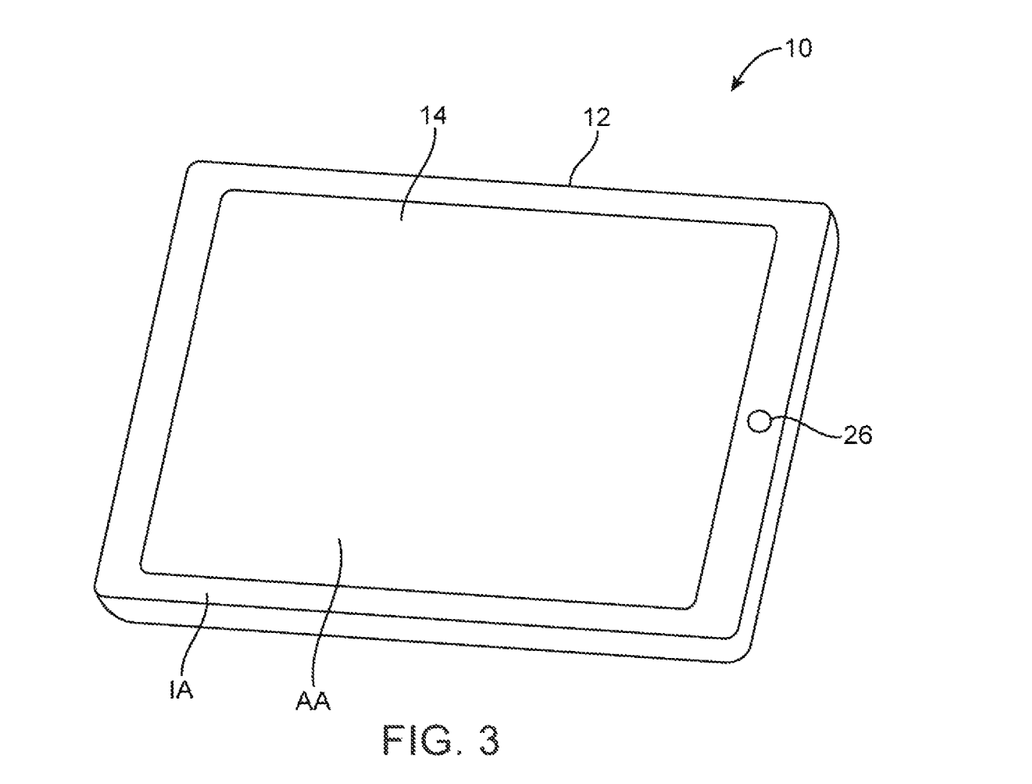
FIG. 3 is a perspective view of an illustrative electronic device such as a tablet computer with a display-integrated light sensor in accordance with an embodiment.

In the example of FIG. 3, electronic device 10 is a tablet computer. In electronic device 10 of FIG. 3, housing 12 has opposing planar front and rear surfaces. Display 14 is mounted on the front surface of housing 12. As shown in FIG. 3, display 14 has an external layer with an opening to accommodate button 26.

Figure 4:
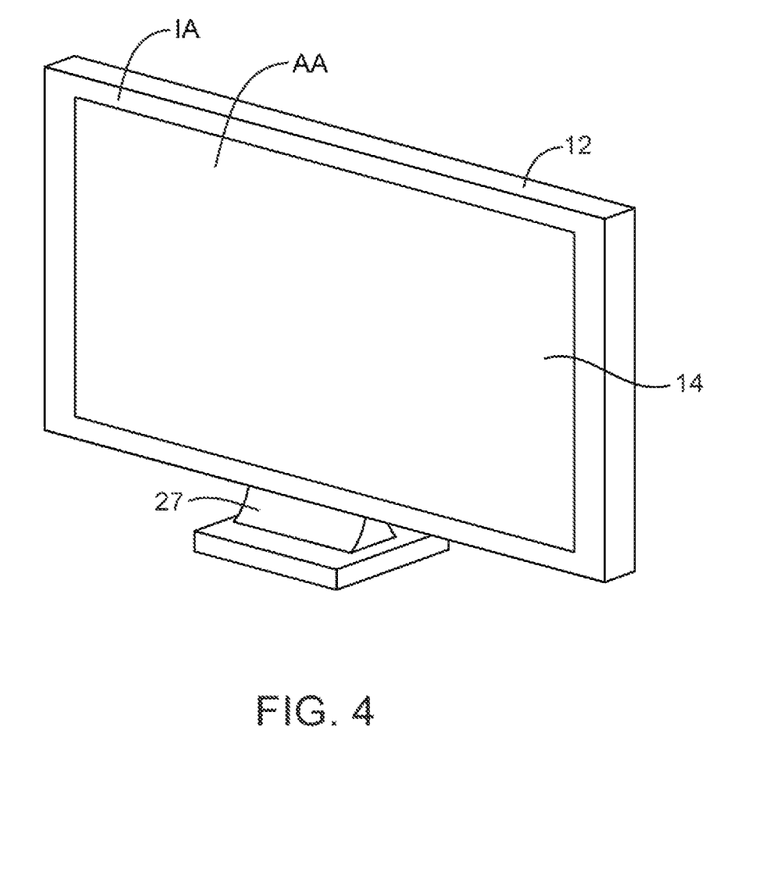
FIG. 4 is a perspective view of an illustrative electronic device such as a computer display with a display-integrated light sensor in accordance with an embodiment.

FIG. 4 shows an illustrative configuration for electronic device 10 in which device 10 is a computer display or a computer that has been integrated into a computer display. With this type of arrangement, housing 12 for device 10 is mounted on a support structure such as stand 27. Display 14 is mounted on a front face of housing 12.

In some configurations, peripheral portions of display 14 are provided with an opaque masking layer. As shown in FIGS. 1, 2, 3, and 4, display 14 may be characterized by a central active region such as active region AA in which an array of display pixels is used in displaying information for a user. An inactive region such as inactive border region IA surrounds active region AA. In the examples of FIGS. 1, 2, 3, and 4, active region AA has a rectangular shape. Inactive region IA has a rectangular ring shape that surrounds active region AA (as an example). Portions of display 14 in inactive region IA may be covered with an opaque masking material such as a layer of black ink (e.g., a polymer filled with carbon black) or a layer of opaque metal. The opaque masking layer helps hide components in the interior of device 10 in inactive region IA from view by a user.

The illustrative configurations for device 10 that are shown in FIGS. 1, 2, 3, and 4 are merely illustrative. In general, electronic device 10 may be a laptop computer, a computer monitor containing an embedded computer, a tablet computer, a cellular telephone, a media player, or other handheld or portable electronic device, a smaller device such as a wrist-watch device, a pendant device, a headphone or earpiece device, or other wearable or miniature device, a television, a computer display that does not contain an embedded computer, a gaming device, a navigation device, an embedded system such as a system in which electronic equipment, with a display is mounted in a kiosk or automobile, equipment that implements the functionality of two or more of these devices, or other electronic equipment.

Housing 12 of device 10, which is sometimes referred to as a case, is formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch-sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Displays for device 10 may, in general, include image pixels formed from light-emitting diodes (LEDs), organic LEDs (OLEDs), plasma cells, electrowetting pixels, electrophoretic pixels, liquid crystal display (LCD) components, or other suitable image pixel structures. In some situations, it may be desirable to use OLED components to form display 14, so configurations for display 14 in which display 14 is an organic light-emitting diode display are sometimes described herein as an example. Other types of display technology may be used in device 10, if desired.

A display cover layer may cover the surface of display 14 or a display layer such as a color filter layer or other portion of a display may be used as the outermost, (or nearly outermost) layer in display 14. The outermost display layer may be formed from a transparent glass sheet, a clear plastic layer, or other transparent member.

Figure 5:
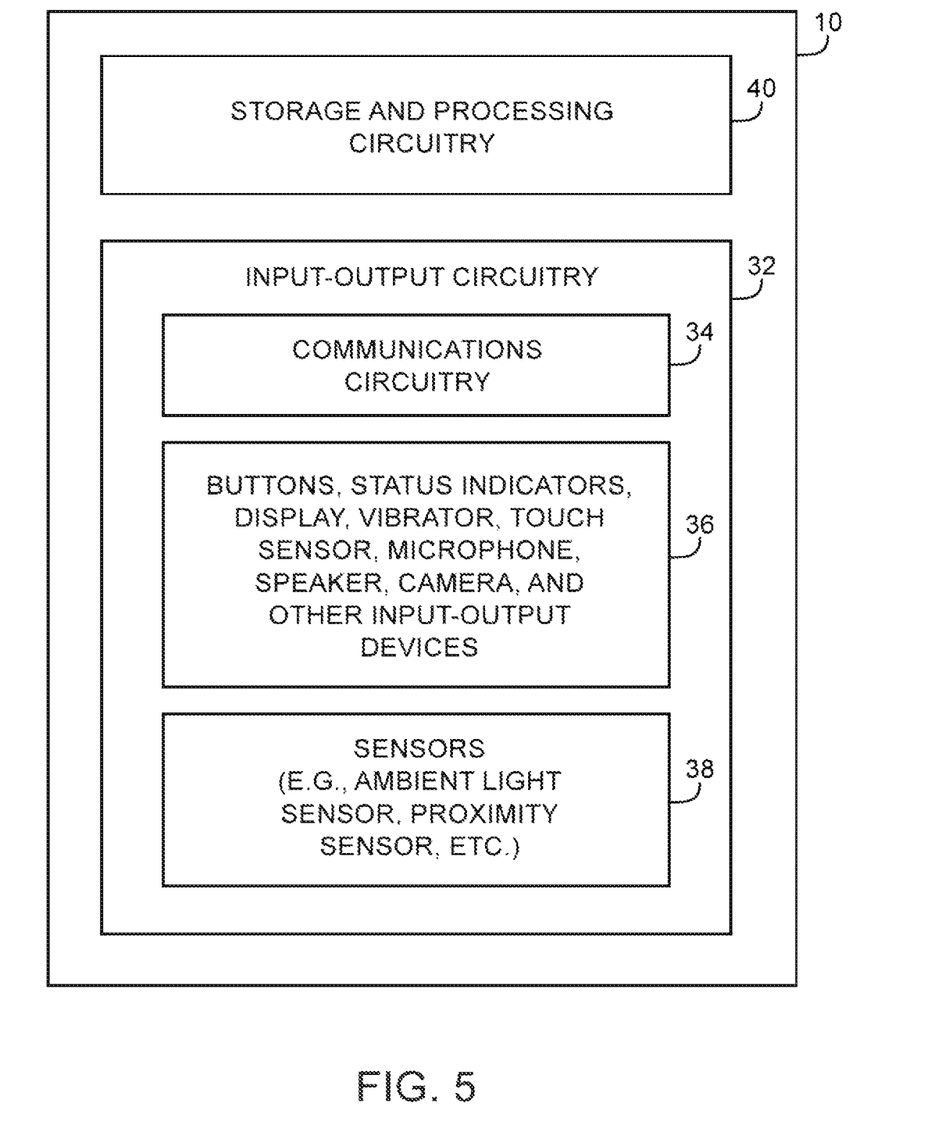
FIG. 5 is a schematic diagram of an illustrative electronic device with a display in accordance with an embodiment.

A schematic diagram of device 10 is shown in FIG. 5. As shown in FIG. 5, electronic device 10 includes control circuitry such as storage and processing circuitry 40. Storage and processing circuitry 40 includes one or more different types of storage such as hard disk drive storage, nonvolatile memory (e.g., flash memory or other electrically-programmable-read-only memory), volatile memory (e.g., static or dynamic random-access-memory), etc. Processing circuitry in storage and processing circuitry 40 is used in controlling the operation of device 10. The processing circuitry may be based on a processor such as a microprocessor and other integrated circuits.

With one suitable arrangement, storage and processing circuitry 40 is used to run software on device 10 such as internet browsing applications, email applications, media playback applications, operating system functions, software for capturing and processing images, software for implementing functions associated with gathering and processing sensor data, etc.

Input-output, circuitry 32 is used to allow data to be supplied to device 10 and to allow data to be provided from device 10 to external devices.

Input-output circuitry 32 can include wired and wireless communications circuitry 34. Communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals. Wireless signals can also be sent using light (e.g., using infrared communications).

Input-output circuitry 32 of FIG. 5 includes input-output devices 36 such as buttons, joysticks, click wheels, scrolling wheels, a touch screen such as display 14, other touch sensors such as track pads or touch-sensor-based buttons, vibrators, audio components such as microphones and speakers, image capture devices such as a camera module having an image sensor and a corresponding lens system, keyboards, status-indicator lights, tone generators, key pads, and other equipment for gathering input from a user or other external source and/or generating output for a user.

Sensors 38 of FIG. 5 include a light sensor such as an ambient light sensor for gathering information on ambient light levels. The ambient light sensor includes one or more semiconductor detectors (e.g., silicon-based detectors) or other light detection circuitry. Sensors 38 also include other light sensor components such as proximity sensor components. Proximity sensor components in device 10 can include capacitive proximity sensor components, infrared-light-based proximity sensor components, proximity sensor components based on acoustic signaling schemes, or other proximity sensor equipment. Sensors 38 may also include a pressure sensor, a temperature sensor, an accelerometer, a gyroscope, and other circuitry for making measurements of the environment surrounding device 10.

It can be challenging to mount electrical components such as the components of FIG. 5 within an electronic device. To facilitate mounting of components in housing 12 of device 10, one or more of sensors 38 may be integrated into the display layers of display 14. For example, device 10 may include a display-integrated ambient light sensor, a display-integrated proximity sensor, other display-integrated light sensor circuitry, or other display-integrated sensor circuitry. A display-integrated light sensor (e.g., a proximity sensor or an ambient light sensor) can be formed on a layer of display 14 that includes conductive traces such as a touch-sensor layer, a thin-film transistor layer associated, with light-generating layers of the display, a sensor layer, or any other display layer that has conductive traces.

Figure 6:
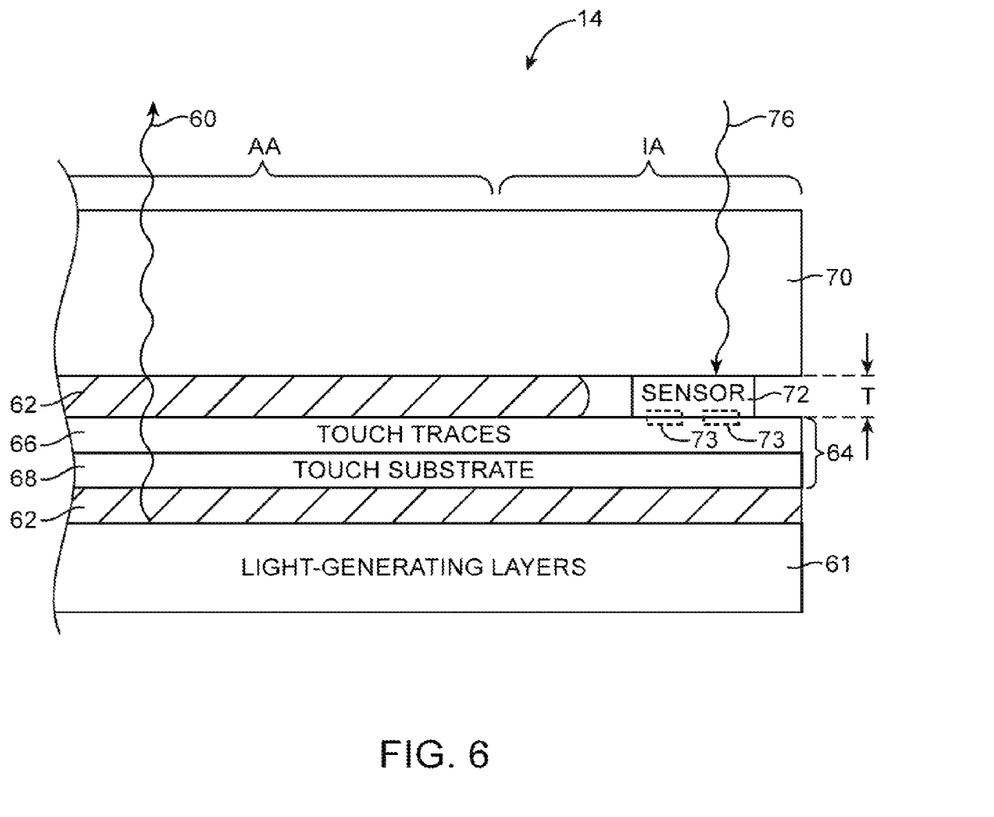
FIG. 6 is a cross-sectional side view of an illustrative display having a display-integrated light sensor attached to a touch-sensitive layer of the display in accordance with an embodiment.

FIG. 6 is a cross-sectional view of display 14 showing how a display-integrated light sensor may be coupled to a touch-sensor layer of the display. In the example of FIG. 6, display 14 includes a touch-sensitive layer 64 that is interposed between light-emitting layers such as light-generating layers 61 and a cover layer such as cover layer 70. Adhesive 62 such as transparent adhesive (sometimes referred to as optically clear adhesive (OCA)) attaches one side of touch-sensitive layer 64 to cover layer 70. Additional adhesive 62 attaches light-generating layers 61 to an opposing side of touch-sensitive layer 64.

Touch-sensitive layer 64 is formed from a layer of touch traces such as layer 66 that is formed on a touch substrate such as substrate 68. Substrate 68 may be formed from any suitable transparent material (e.g., glass, transparent plastic, or other transparent polymers). Touch traces in layer 66 may be formed from an array of indium tin oxide electrodes or other transparent electrodes. The electrodes are used in making capacitive touch sensor measurements.

A sensor such as light sensor 72 is electrically coupled to conductive traces in touch trace layer 66. Conductive traces that are coupled to sensor 72 may be formed from transparent conductive materials such as indium tin oxide or may be formed from opaque conductive material such as metal (e.g., copper). Sensor 72 receives light 76 though transparent cover layer 70. Sensor 72 has a thickness T. Thickness T may be between 0.1 mm and 1.1 mm, between 0.1 mm and 0.6 mm, between 0.1 mm and 0.5 mm, between 0.6 mm and 1.1 mm, between 0.5 mm and 1.1 mm, less than 1.5 mm, or greater than 0.01 mm (as examples).

Sensor 72 may be implemented as an ambient light sensor, a proximity sensor, or any other sensor. In the example of FIG. 6, sensor 72 transmits sensor data (e.g., ambient light data, object proximity data, or other data) to storage and processing circuitry 40 (FIG. 5) through conductive traces in touch traces layer 66. Conductive contacts 73 may be provided that electrically couple sensor 72 to conductive traces in layer 66. Conductive contacts 73 may foe formed from conductive materials such as solder, conductive adhesive (e.g., an anisotropic conductive film), mechanical connectors or other electrical coupling structures. However, this is merely illustrative. If desired, sensor circuitry (e.g., photosensitive elements or other sensor circuitry) may be formed directly on substrate 68.

Light-generating layers 61 of display 14 may include any suitable display technology (e.g., liquid crystal display pixels, light-emitting diodes, organic light-emitting diodes, plasma cells, electrowetting pixels, electrophoretic pixels, or other suitable image display circuitry) for generating image light 60 in active area AA of display 14. In one suitable example that is sometimes discussed herein as an example, light-generating layers 61 are implemented using organic light-emitting diode image display technology.

Figure 7:
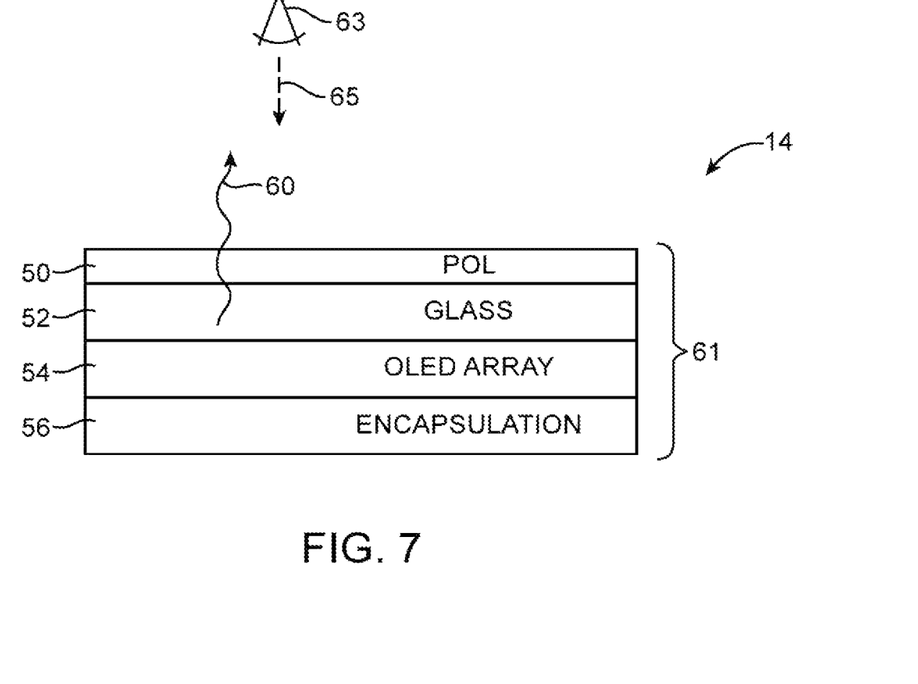
FIG. 7 is a cross-sectional side view of illustrative light-generating layers of a bottom emission organic light-emitting diode display in accordance with an embodiment.
Figure 8:
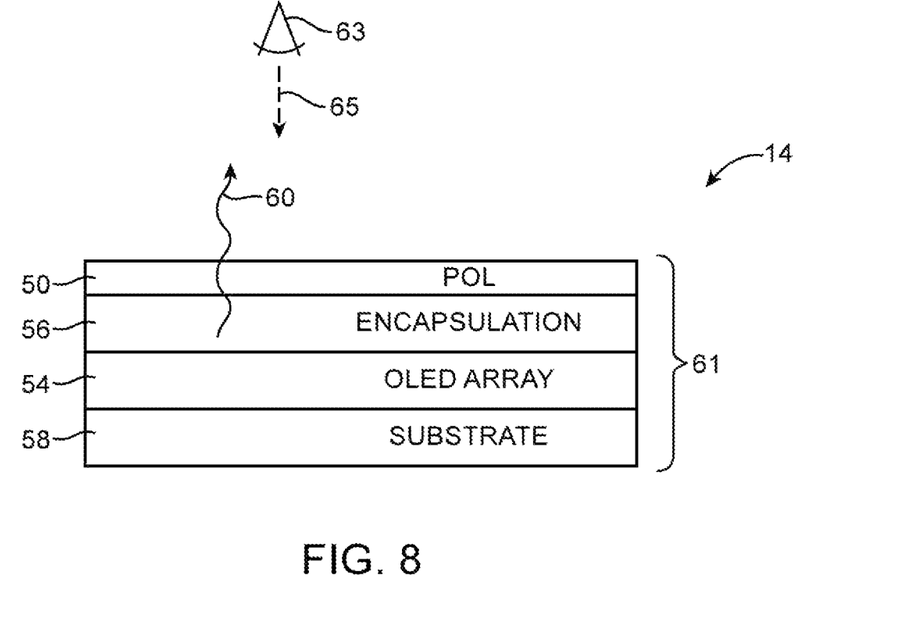
FIG. 8 is a cross-sectional side view of light-generating layers of a top emission organic light-emitting diode display in accordance with an embodiment.

Cross-sectional side views of configurations that may be used for light-generating layers 61 of display 14 (e.g., for display 14 of the devices of FIG. 1, FIG. 2, FIG. 3, FIG. 4, or other suitable electronic devices) are shown in FIGS. 7 and 8. FIG. 7 is a cross-sectional side view of an illustrative bottom emission organic light-emitting diode display. FIG. 8 is a cross-sectional side view of an illustrative top emission organic light-emitting diode display.

In a configuration for display 14 of the type shown in FIG. 7, light-generating layers 61 include a transparent substrate layer such as glass layer 52. A layer of organic light-emitting diode structures such as organic light-emitting diode layer 54 is formed on the underside of glass layer 52. An encapsulation layer such as encapsulation layer 56 is used to encapsulate organic light-emitting diode layer 54. Encapsulation layer 56 may be formed from a layer of metal foil, metal foil covered with plastic, other metal structures, a glass layer, a thin-film encapsulation layer formed from a material such as silicon nitride, a layered stack of alternating polymer and ceramic materials, or other suitable material for encapsulating organic light-emitting diode layer 54. Encapsulation layer 56 protects organic light-emitting diode layer 54 from environmental exposure by preventing water and oxygen from reaching organic emissive materials within organic light-emitting diode layer 54.

Organic light-emitting diode layer 54 contains an array of thin-film transistors. The thin-film transistors may be formed from semiconductors such as amorphous silicon, polysilicon, or compound semiconductors (as examples). Signal lines (e.g., a grid of horizontal and vertical metal lines) may be used in applying control signals to the array of thin-film transistors. During operation, signals are applied to the organic light-emitting diodes in layer 54 using the signal lines so that an image is created on display 14. Image light 60 from the organic light-emitting diode pixels in layer 54 is emitted upwards through transparent glass layer 52 for viewing in direction 65 by viewer 63. Circular polarizer 50 may suppress reflections from the metal signal lines in layer 54 that might otherwise be visible to viewer 63.

In a configuration for display 14 of the type shown in FIG. 8, light-generating layers 61 include a substrate layer such as substrate layer 58. Substrate layer 58 may be a polyimide layer that is temporarily carried on a glass carrier during manufacturing or may be a layer formed from glass or other suitable substrate materials.

Organic light-emitting diode layer 54 is formed on the upper surface of substrate 58. An encapsulation layer such as encapsulation layer 56 encapsulates organic light-emitting diode layer 54. During operation, individually controlled pixels in organic light-emitting diode layer 54 generate image light 60 for viewing in direction 65 by viewer 63. Circular polarizer 50 suppresses reflections from metal signal lines in layer 54. If desired an array of color filter elements may be included, in polarizer layer 50.

Figure 9:
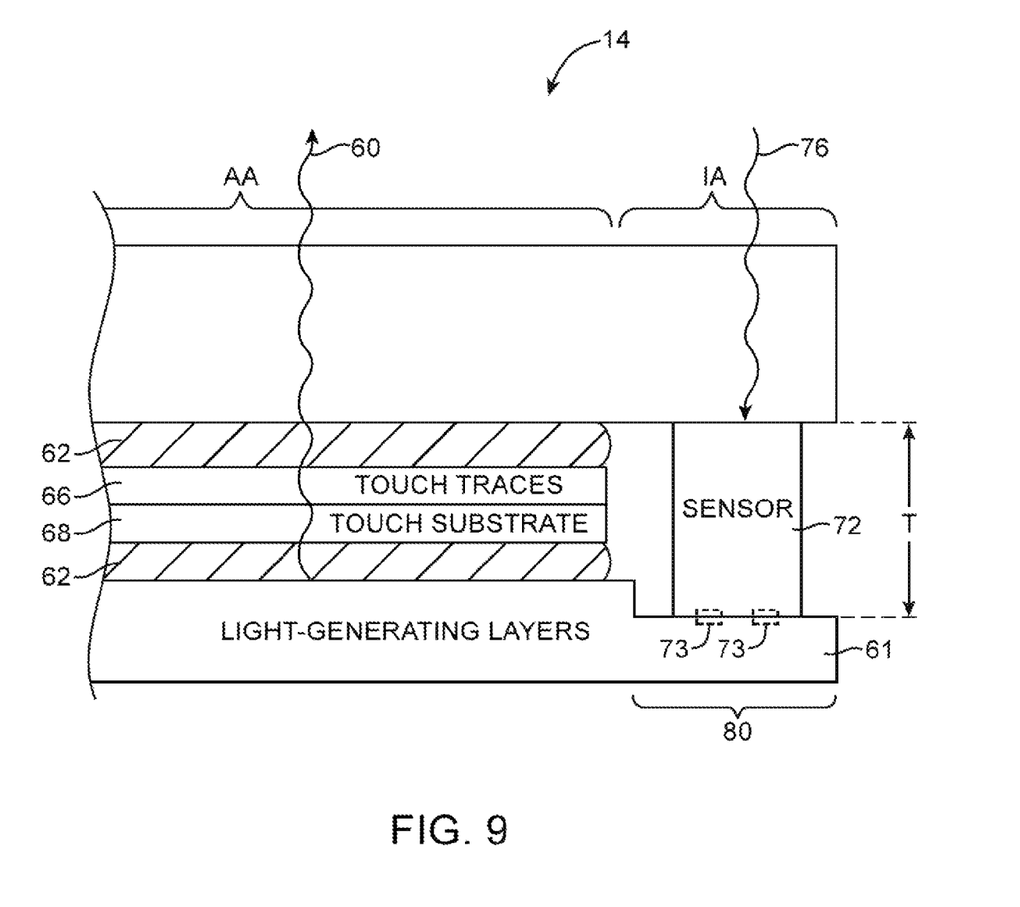
FIG. 9 is a cross-sectional side view of an illustrative display having a display-integrated light sensor attached to light-generating layers of the display in accordance with an embodiment.
Figure 10:
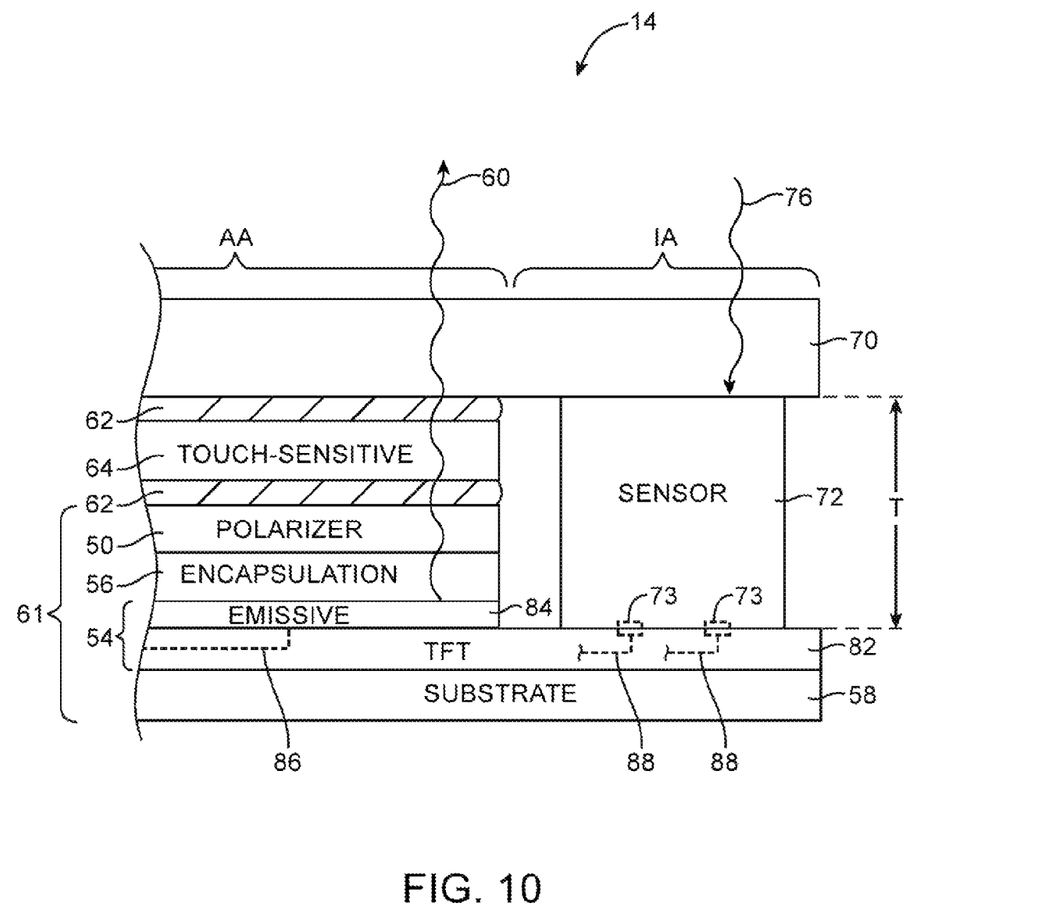
FIG. 10 is a cross-sectional side view of an illustrative display having a display-integrated light sensor attached to a thin-film transistor layer of a top emission organic light-emitting diode display in accordance with an embodiment.
Figure 11:
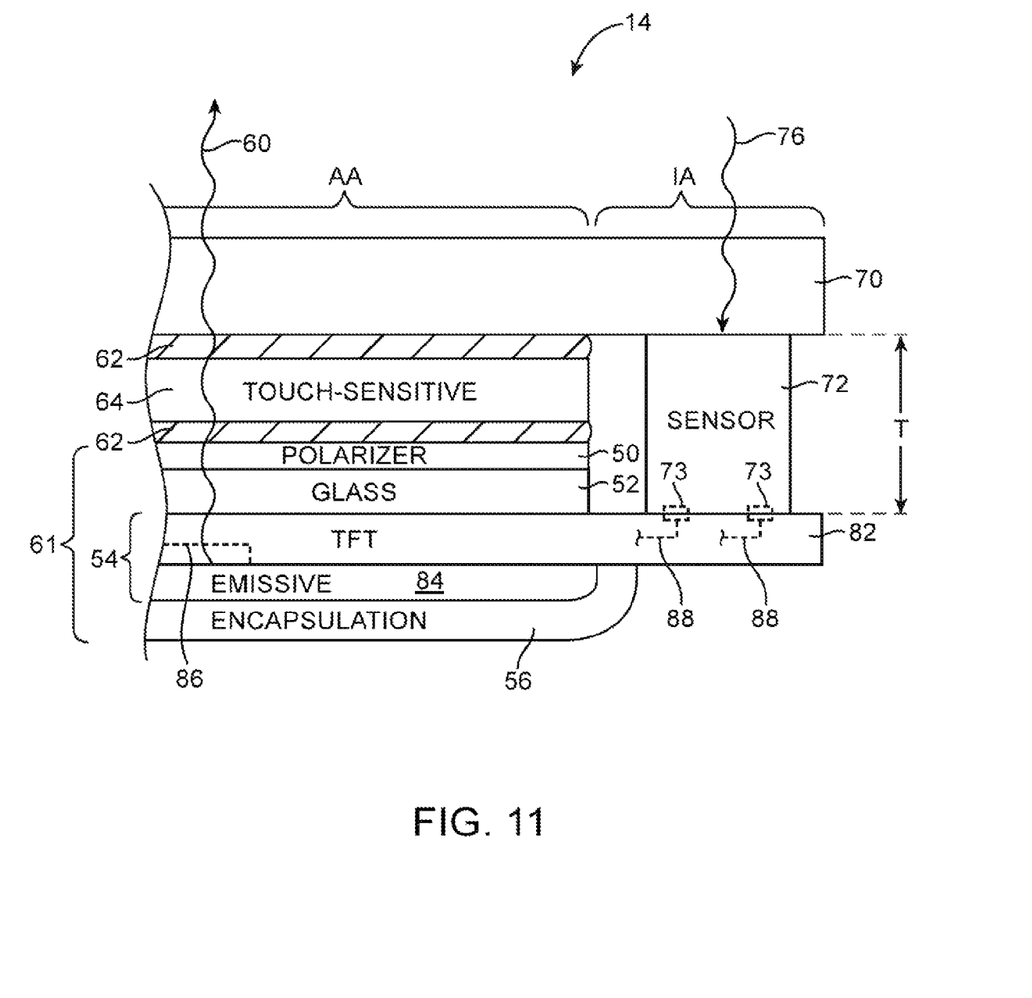
FIG. 11 is a cross-sectional side view of an illustrative display having a display-integrated light sensor attached to a thin-film transistor layer of a bottom emission organic light-emitting diode display in accordance with an embodiment.

FIG. 9 is a cross-sectional view of display 14 showing how a display-integrated light sensor such as sensor 72 may be coupled to light-generating layers 61 of the display. In the example of FIG. 9, layer 61 includes an extended portion such as portion 80 that extends into inactive area IA of display 14. Extended portion 80 of layers 61 includes fewer display layers than other portions of layers 61. Extended portion 80 may be formed entirely in inactive area IA or may be partially located in active area AA. Extended portion 80 of light-generating layers 61 extends beyond an outer edge of touch-sensitive layers 64. Sensor 72 is electrically coupled to conductive traces on a layer of light-generating layers 61. Sensor 12 may foe coupled to conductive traces on a layer of layers 61 using solder or conductive adhesive (e.g., an anisotropic conductive film), or may be formed directly on a layer of layers 61. As shown in FIGS. 10 and 11, sensor 72 may be coupled to conductive traces on a thin-film transistor layer of a top emission OLED display or a bottom emission OLED display.

FIG. 10 shows a configuration for display 14 in which light generating layers 61 are implemented as a top emission OLED display and light sensor 72 is attached to light-generating layers 61. As shown in FIG. 10, organic-light-emitting diode layer 54 includes thin-film transistor (TFT) layer 82 and a layer of organic light-emitting material such as emissive layer 84. Sensor 72 may be attached to an extended portion of TFT layer 82 that extends beyond encapsulation layer 56 and polarizer layer 50.

TFT layer 82 includes an array of thin-film transistors. The thin-film transistors may be formed from semiconductors such as amorphous silicon, polysilicon, or compound semiconductors (as examples). Organic emissive layer 84 may be formed from organic plastics such as polyfluorene or other organic emissive materials. Encapsulation layer 56 covers emissive layer 84 and, if desired, some or all of TFT layer 82.

Signal lines 86 (e.g., a grid of horizontal and vertical metal lines) transmit control signals to the array of thin-film transistors in TFT layer 82. Signals applied to the thin-film transistors in TFT layer 82 selectively cause portions of emissive layer 84 to emit display light such as light 60. In this way, images are created on display 14 in active area AA.

Thin-film transistors in TFT layer 82 are formed in active area AA. Signal lines 86 route signals received from circuitry such as a display driver integrate circuit in inactive area IA to the thin-film transistors in TFT layer 82. Light sensor 72 is attached to the thin-film transistor layer.

Conductive contacts 73 may be provided that electrically couple sensor 72 to signal lines such as signal lines 88 in TFT layer 82. Signal lines 88 route sensor control signals from circuitry such as storage and processing circuitry 40 (FIG. 5) to sensor 72 and route sensor signals (e.g., ambient light signals, object proximity signals, etc.) from sensor 72 to circuitry such as storage and processing circuitry 40. Conductive contacts 73 may be formed from conductive materials such as solder, conductive adhesive (e.g., an anisotropic conductive film), mechanical connectors or other electrical coupling structures. However, this is merely illustrative. If desired, sensor circuitry (e.g., photosensitive elements or other sensor circuitry) may be formed directly on TFT layer 82.

The example of FIG. 10 in which sensor 72 is attached to a thin-film transistor layer of a top emission OLED display is merely illustrative. If desired, sensor 72 may be attached to a display layer of another type of display such as a liquid crystal display or a bottom emission OLED display.

FIG. 11 shows a configuration for display 14 in which light generating layers 61 are implemented as a bottom emission OLED display and light sensor 72 is attached to light-generating layers 61. As shown in FIG. 11, as shown in FIG. 11, emissive layer 84 may be formed on a bottom side of TFT layer 82. Sensor 72 is attached to an extended portion of TFT layer 82 that extends beyond encapsulation layer 56, glass layer 52, and polarizer layer 50. In this type of configuration, sensor 72 is electrically coupled to a surface of TFT layer 82 that is opposite to the surface on which emissive layer 84 is attached to TFT layer 82. Sensor 72 is formed along an edge of glass layer 52, polarizer layer 50, and touch-sensitive layer 64.

The examples of FIGS. 6, 9, 10, and 11 in which sensor 72 is attached to a touch-sensitive layer or one of one light-generating layers of display 14 are merely illustrative. A display-integrated, light sensor may be attached to other layers of a display, if desired.

Figure 12:
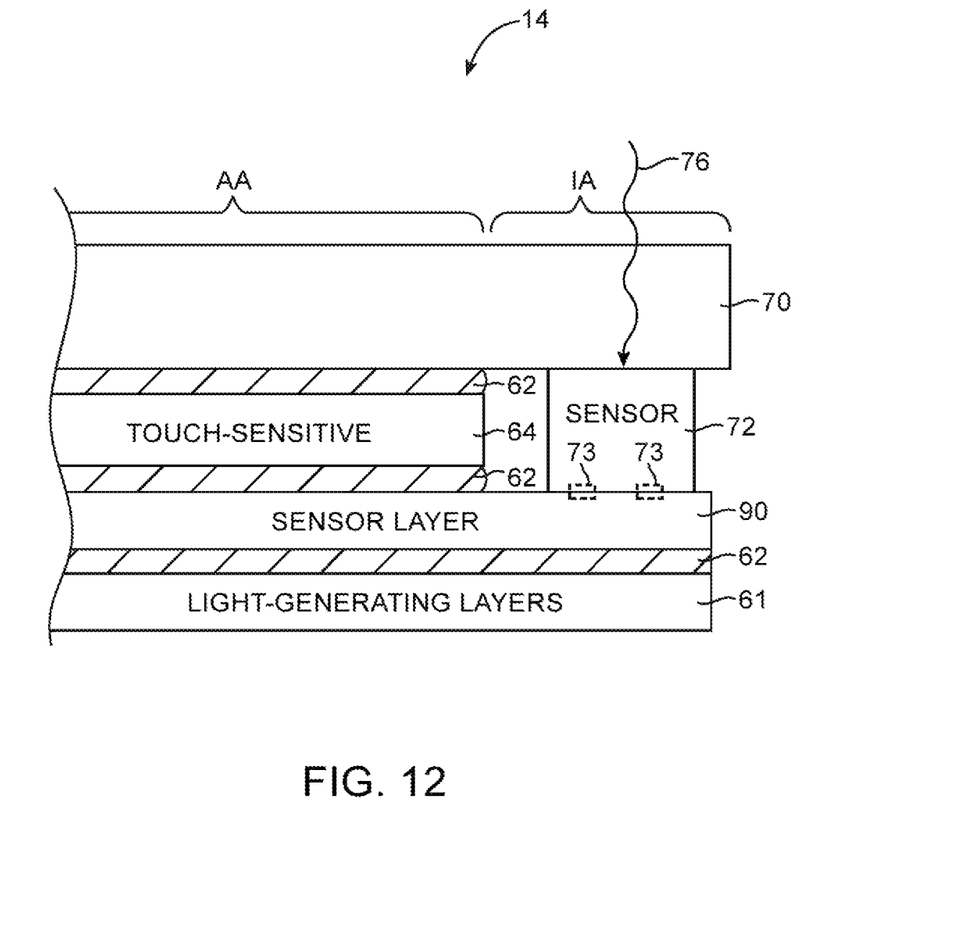
FIG. 12 is a cross-sectional side view of an illustrative display having a display-integrated light-sensor attached to a sensor layer of the display in accordance with an embodiment.

FIG. 12 is a cross-sectional view of display 14 showing how a display-integrated light sensor such as sensor 72 may be coupled, to an additional layer of the display such as sensor layer 90. In the example of FIG. 12, display 14 includes an additional sensor layer 90. Adhesive 62 attaches light-generating layers 61 to sensor layer 90. However, this is merely illustrative. If desired, sensor layer 90 may be formed in other locations within display 14 (e.g., interposed between touch-sensitive layer 64 and cover layer 70, interposed between two of light-generating layers 61, or integrated with touch-sensitive layer 64).

Sensor layer 90 generates sensor signals to be transmitted to circuitry in device 10 (e.g., storage and processing circuitry 40 of FIG. 5). Sensor layer 90 may be a pressure sensing layer, a force sensing layer, a temperature sensing layer, a humidity sensing layer, an acoustic sensing layer, a layer having accelerometer circuitry, a layer having gyroscope circuitry, or a layer having other circuitry for making measurements of the environment surrounding device 10. Conductive contacts 73 (e.g., solder-based contacts, conductive adhesive-based contacts, etc.) can be used to attach sensor 72 to sensor layer 90 or sensor circuitry such as light-sensitive elements and/or light-emitting diodes may be formed directly on a substrate such as a silicon substrate in sensor layer 90.

Figure 13:
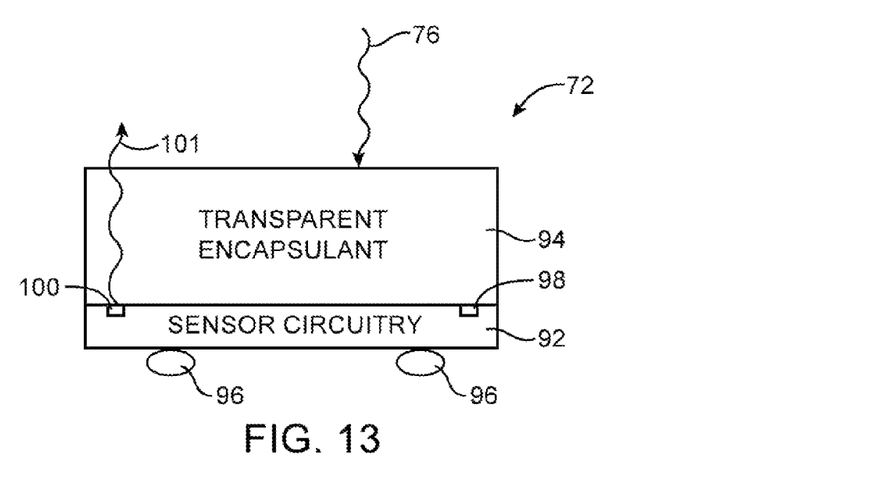
FIG. 13 is a side view of an illustrative light sensor that may be implemented as a display-integrated light sensor in accordance with an embodiment.
Figure 14:
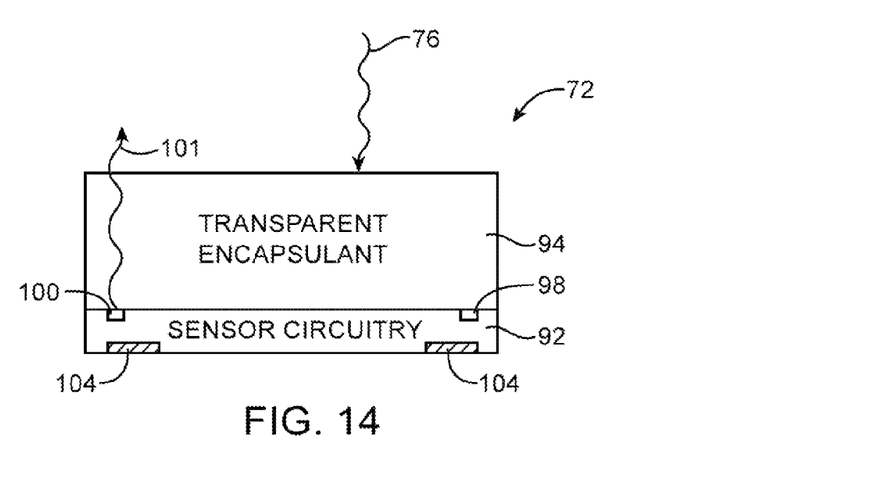
FIG. 14 is a side view of an illustrative light sensor having conductive contacts that may be implemented as a display-integrated light sensor in accordance with an embodiment.

FIGS. 13 and 14 are diagrams showing how sensor 72 may be implemented as a packaged light sensor. The packaged light sensor of FIGS. 13 and 14 can be integrated into the layers of display 14 as shown in any of FIGS. 6, 9, 10, 11, and 12 or may be otherwise integrated into display 14.

In the example of FIG. 13, sensor 72 includes a layer of sensor circuitry such as sensor circuitry layer 92. Sensor circuitry layer 92 includes sensor circuitry elements such as light-sensitive element 98 and light-emitting element 100. Light-sensitive element 98 and light-emitting element 100 may be formed on a substrate such as a silicon substrate (e.g., a printed circuit such as a rigid printed circuit, a flexible printed circuit, or other substrate having electrical interconnects and other electrical components in a layered circuit stack).

A protective material such as transparent encapsulant 94 is formed over sensor circuitry elements 98 and 100 on circuitry layer 92. Transparent encapsulant 94 may be formed from transparent, materials such as glass or transparent plastic. Transparent encapsulant 94 protects sensor circuitry 92 and allows light such as light 76 to pass through encapsulant 94 onto light-sensitive element 98 and allows light such as light 101 to be emitted from light-emitting element 100 through encapsulant 94.

Light-emitting element 100 may be an infrared light-emitting diode (as an example). However, this is merely illustrative. If desired, light-emitting element 100 may be a visible light-emitting diode, or other light-emitting element. If desired, sensor 72 may be provided without any light-emitting components. In configurations in which sensor 72 is provided, with a light-emitting element 100, sensor 72 may detect the proximity of objects in the vicinity of device 10 by detecting portions of light 101 that are reflected from the objects using light-sensitive element 98. In configurations in which sensor 72 is provided without a light-emitting element, sensor 72 may detect the brightness of ambient light in the environment surrounding device 10 by detecting the ambient light intensity using light-sensitive element 98.

In the example of FIG. 13, sensor 72 includes solder bumps 96 formed on a bottom surface of sensor circuitry layer 92. Solder bumps 96 can be used to form electrical contacts 73 of FIGS. 6, 9, 10, 11, and 12. However, this is merely illustrative. If desired, sensor circuitry layer 92 may be provided with planar conductive contacts such as contact pads 104 on the bottom surface of layer 92 as shown in FIG. 14.

Contact pads 104 may, for example, be formed from an exposed portion of a copper layer of circuitry layer 92. In configurations in which sensor circuitry layer 92 is provided with contact pads 104, conductive contacts 73 are formed from a conductive adhesive such as an anisotropic conductive film that couples contact pads 104 to conductive traces in a display layer of display 14.

Figure 15:
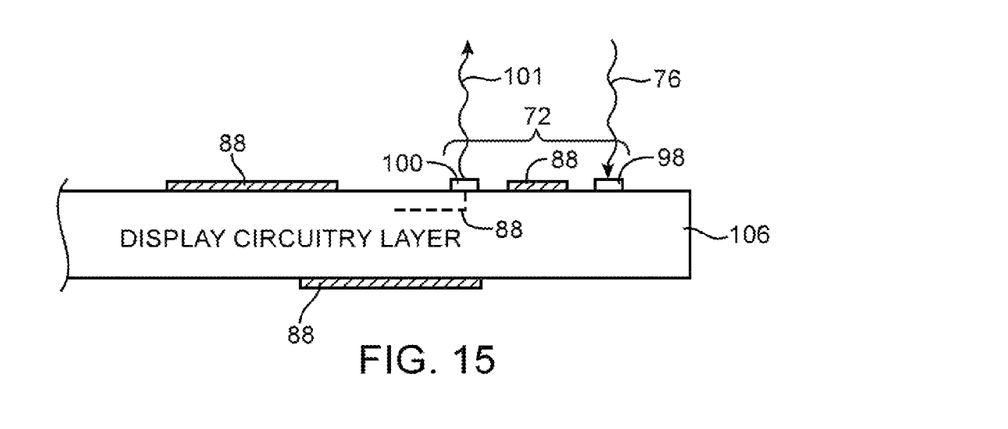
FIG. 15 is a side view of an illustrative display-integrated light sensor that is formed from light-sensor elements that are formed on a display circuitry layer in accordance with an embodiment.

The examples of FIGS. 13 and 14 in which sensor 72 is implemented as a packaged display-integrated light sensor are merely illustrative. As shown in FIG. 15, sensor circuitry such as light-sensitive element 98 and light-emitting element 100 can be formed directly on a display layer of display 14 such as display circuitry layer 106. Display circuitry layer 105 may be touch-sensitive layer 64, TFT layer 82, sensor layer 90, or another display layer having conductive traces 88 for carrying sensor signals from sensor 72 as in any of the configurations described above in connection with FIGS. 6, 9, 10, 11, and 12 (as examples).

Light sensor elements such as elements 98 and 100 may be attached to traces 88 of layer 106 using solder, anisotropic conductive adhesive, or may be otherwise formed on layer 106. In the example of FIG. 15, traces 88 are formed on a top surface, a bottom surface, and embedded within layer 106. However, this is merely illustrative. In various configurations, traces 88 can be formed only on the top surface, only on the bottom surface, only embedded within or formed only on the outer surfaces of layer 106.

The foregoing is merely illustrative and various modifications can be made by those skilled in the art without departing from the scope and spirit of the described embodiments. The foregoing embodiments may be implemented individually or in any combination.

What is claimed is:

1. A display, comprising:
    light-generating layers;
    a transparent cover layer;
    an additional layer having conductive traces, wherein the additional layer is interposed between the light-generating layers and the transparent cover layer; and
    a light sensor at least partially interposed between the light generating layers and the transparent cover layer, wherein the light sensor is electrically coupled to at least one of the light-generating layers.

2. The display defined in claim 1, wherein the light-generating layers comprise a thin-film transistor layer, and wherein the light sensor is electrically coupled to the thin-film transistor layer.

3. The display defined in claim 2, wherein the light-generating layers comprise a layer of organic emissive material formed on the thin-film transistor layer.

4. The display defined in claim 3, wherein the layer of organic emissive material is interposed between the thin-film transistor layer and the transparent cover layer.

5. The display defined in claim 3, wherein the thin-film transistor layer is interposed between the layer of organic emissive material and the transparent cover layer.

6. The display defined in claim 3, wherein the thin-film transistor layer has first and second opposing surfaces, and wherein the light sensor and the layer of organic emissive material are formed on the first surface.

7. The display defined in claim 3, wherein the thin-film transistor layer has first and second opposing surfaces, wherein the light sensor is attached to the first surface, and wherein the layer of organic emissive material is formed on the second surface.

8. The display defined in claim 1, wherein the additional layer comprises a touch-sensitive layer.

9. A display, comprising:
    a cover layer;
    a light-emitting layer;
    a first substrate interposed between the light-emitting layer and the cover layer and having conductive traces formed thereon;
    a second substrate interposed between the first substrate and the cover layer and having conductive traces formed thereon; and
    a light sensor electrically coupled to the conductive traces on the first substrate.

10. The display defined in claim 9, wherein the first substrate forms at least part of a thin-film transistor layer.

11. The display defined in claim 10, wherein the thin-film transistor layer comprises the conductive traces on the first substrate.

12. The display defined in claim 10, wherein the thin-film transistor layer comprises first and second opposing surfaces, wherein the light-emitting layer is formed on the first surface, and wherein the light sensor is attached to the second surface.

13. The display defined in claim 10, wherein the second substrate forms at least part of a touch-sensitive layer.

14. The display defined in claim 13, wherein the touch-sensitive layer comprises the conductive traces on the second substrate.

15. A display, comprising:
    light-generating layers;
    a touch-sensitive layer;
    an additional layer having conductive traces interposed between the light-generating layers and the touch-sensitive layer; and
    a light sensor electrically coupled to the conductive traces on the additional layer.

16. The display defined in claim 15, wherein the light-generating layers comprise at least one layer having conductive traces formed thereon.

17. The display defined in claim 16, wherein the touch-sensitive layer comprises conductive traces formed thereon.

18. The display defined in claim 16, wherein the at least one layer having the conductive traces formed thereon comprises a thin-film transistor layer, and wherein the light-generating layers further comprise a layer of organic emissive material formed on the thin-film transistor layer.

19. The display defined in claim 15, wherein the light sensor comprises at least one light-emitting component.

20. The display defined in claim 15, wherein the additional layer is configured to transmit signals from the light sensor to control circuitry that controls the display.

\* \* \* \* \*